United States Patent [19]
Yamamoto et al.

[11] Patent Number: 5,162,068
[45] Date of Patent: Nov. 10, 1992

[54] METHOD FOR PREVENTING OXIDATION OF LEAD FRAME IN BONDING SYSTEM

[75] Inventors: Masayuki Yamamoto; Kazuyuki Hayashi, both of Fukuoka, Japan

[73] Assignee: Mitsubishi Denki Kabushiki Kaisha, Tokyo, Japan

[21] Appl. No.: 769,164

[22] Filed: Sep. 30, 1991

Related U.S. Application Data

[60] Continuation of Ser. No. 477,473, Feb. 9, 1990, abandoned, which is a division of Ser. No. 305,024, Feb. 2, 1989, Pat. No. 4,938,834.

[30] Foreign Application Priority Data

Mar. 23, 1988 [JP] Japan .................................. 63-39111

[51] Int. Cl.⁵ ..................... B32B 31/14; B23K 31/02
[52] U.S. Cl. .................................. 156/285; 156/497; 29/840; 219/56.22; 228/220
[58] Field of Search ............... 156/285, 382, 381, 497; 228/220, 219, 42; 219/56.22; 29/831, 840, 854; 250/492.1; 34/23, 34, 148

[56] References Cited

U.S. PATENT DOCUMENTS 4,732,313  3/1988  Kobayashi et al. ............... 219/56.22

FOREIGN PATENT DOCUMENTS 58-159739 10/1983 Japan .
62-178533 11/1987 Japan .

Primary Examiner—Michael W. Ball
Assistant Examiner—Michele K. Yoder
Attorney, Agent, or Firm—Leydig, Voit & Mayer

[57] ABSTRACT

Disclosed is a method for preventing the oxidation of a lead frame in a bonding system comprising the steps of introducing a first atmospheric gas toward a bonding portion of a lead frame along a surface of the lead frame and supplying a second atmospheric gas to shield the bonding portion from contact with ambient air simultaneously with the introduction of the first atmospheric gas.

3 Claims, 3 Drawing Sheets

METHOD FOR PREVENTING OXIDATION OF LEAD FRAME IN BONDING SYSTEM

This application is a continuation of application Ser. No. 07/477,473, filed Feb. 9, 1990, now abandoned, which is a divisional application of application Ser. No. 07/305,024, filed Feb. 2, 1989, now U.S. Pat. No. 4,938,834.

BACKGROUND OF THE INVENTION

1. Field of the Invention

The present invention relates to a method and an apparatus for preventing the oxidation of a lead frame in a bonding system. More particularly, the present invention concerns a method and an apparatus for preventing the oxidation of a lead frame in a bonding system such as the wire bonding of the electrodes of a semiconductor chip to a lead frame and the die bonding of a semiconductor chip to a lead frame.

2. Description of the Related Art

Generally, lead frames formed of an FeNi alloy or the like are susceptible to oxidation if they are brought into contact with the atmosphere. Therefore, when wire bonding or die bonding is performed, it is necessary to take measures to prevent the oxidation of the lead frames. In one method of preventing oxidation, a reducing gas or an inert gas is introduced into the vicinity of a lead frame being bonded.

FIG. 1 shows a partially cross-sectional view of a conventional wire bonding system which prevents oxidation of a lead frame by using such a method. A lead frame 1 with a semiconductor chip 2 mounted thereon is placed on a guide rail (not shown) and is held down by a frame holder body 6. At this stage of the process, the lead frame 1 is positioned with the semiconductor chip 2 located inside an opening 6a provided in a recess 6c of the frame holder body 6, and the lead frame 1 is held by a leg 6b of the frame holder body 6. A cover member 7 having an opening 7a corresponding to the opening 6a of the frame holder body 6 is disposed above the recess 6c of the frame holder body 6. A discharge port 8 for discharging an atmospheric gas such as a reducing gas or an inert gas is formed between the underside of this cover member 7 and the innermost surface of the recess 6c of the frame holder body 6. In addition, one end of an atmospheric gas-supplying pipe 10 is connected to the discharge port 8 via a joint 9, while the other end thereof is connected to a gas-supplying device (not shown).

During operation, the atmospheric gas is introduced from the unillustrated gas-supplying device to the discharge port 8 via the pipe 10. As shown in FIG. 2, this atmospheric gas produces a flow B which passes through the vicinity of an edge portion 6d provided around the opening 6a of the frame holder body 6 and is introduced to the lead frame 1 and the semiconductor chip 2 from above. This atmospheric gas serves to prevent the air from contacting the lead frame 1.

However, since the atmospheric gas is discharged downward from the discharge port 8 as the flow B, as shown in FIG. 2, a vacuum is created in the vicinity of the flow B of the gas. In consequence, there has been a problem in that the air flowing in through the opening 7a of the cover member 7 due to the vacuum can be caught in this flow B of the gas, as shown by the broken line C, and is brought into contact with the lead frame 1, thereby oxidizing the same.

SUMMARY OF THE INVENTION

Accordingly, an object of the present invention is to provide a method and an apparatus for preventing the oxidation of a lead frame which are capable of positively preventing the oxidation of the lead frame during bonding, thereby overcoming the above-described drawback of the prior art.

To this end, according to one aspect of the present invention, there is provided a method for preventing the oxidation of a lead frame in a bonding system comprising the steps of introducing a first atmospheric gas toward a bonding portion of a lead frame along a surface of the lead frame and supplying a second atmospheric gas to shield ambient air from contact with the bonding portion simultaneously with the introduction of the first atmospheric gas.

According to another aspect of the present invention, there is provided an apparatus for preventing the oxidation of a lead frame in a bonding system comprising first introducing means for introducing a first atmospheric gas toward a bonding portion of the lead frame and second introducing means for introducing a second atmospheric gas to prevent ambient air from contacting the bonding portion simultaneously with the introduction of the first atmospheric gas.

DESCRIPTION OF THE PREFERRED EMBODIMENT

A preferred embodiment of the present invention will now be described with reference to the accompanying drawings.

Figure 1:
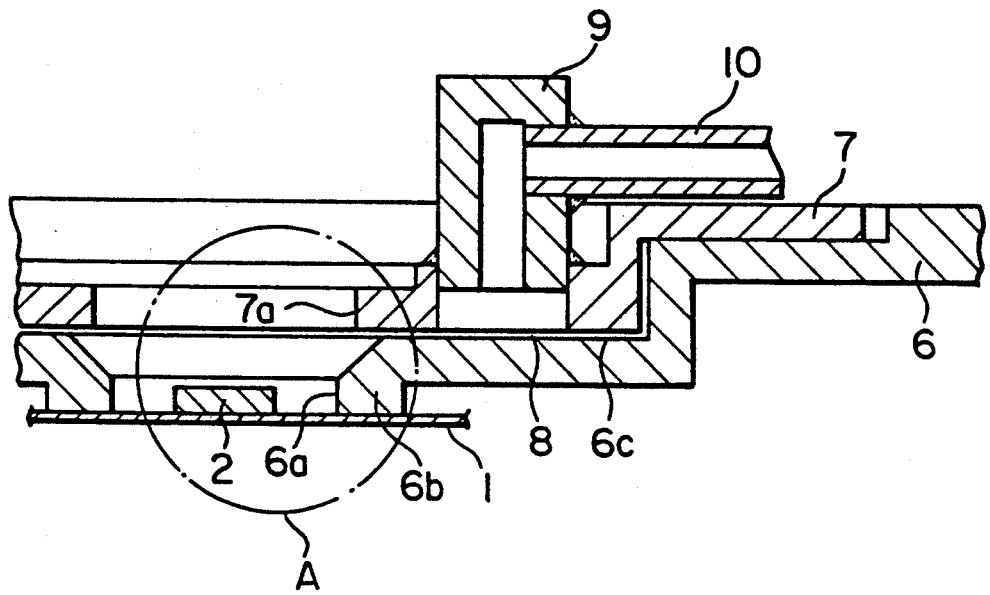
FIG. 1 is a partial cross-sectional view of a conventional wire bonding system.
Figure 2:
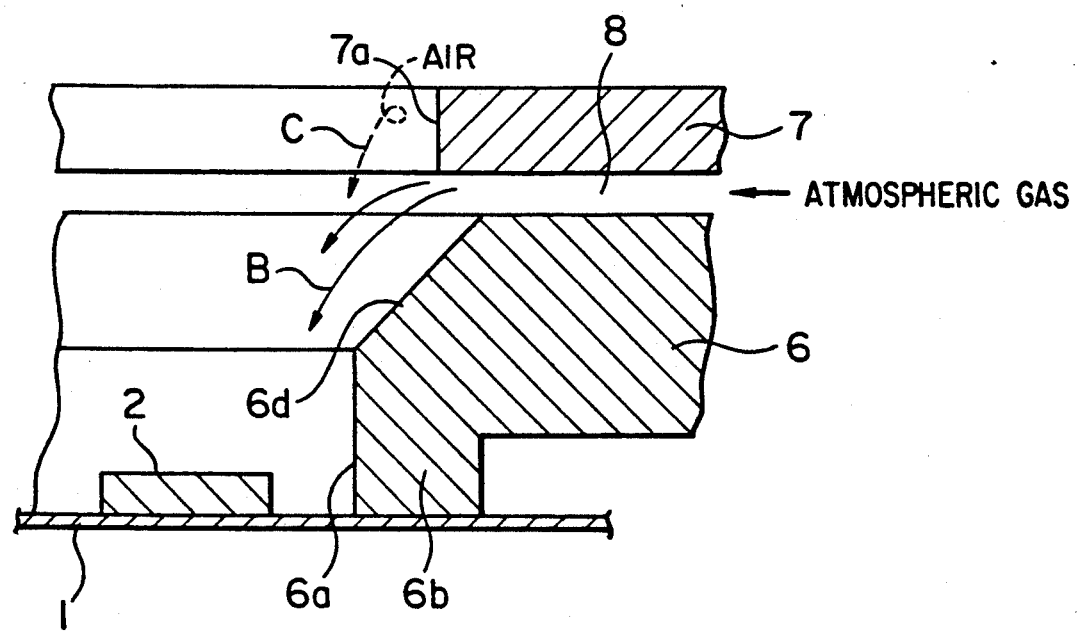
FIG. 2 is an enlarged view of a portion A shown in FIG. 1.
Figure 3:
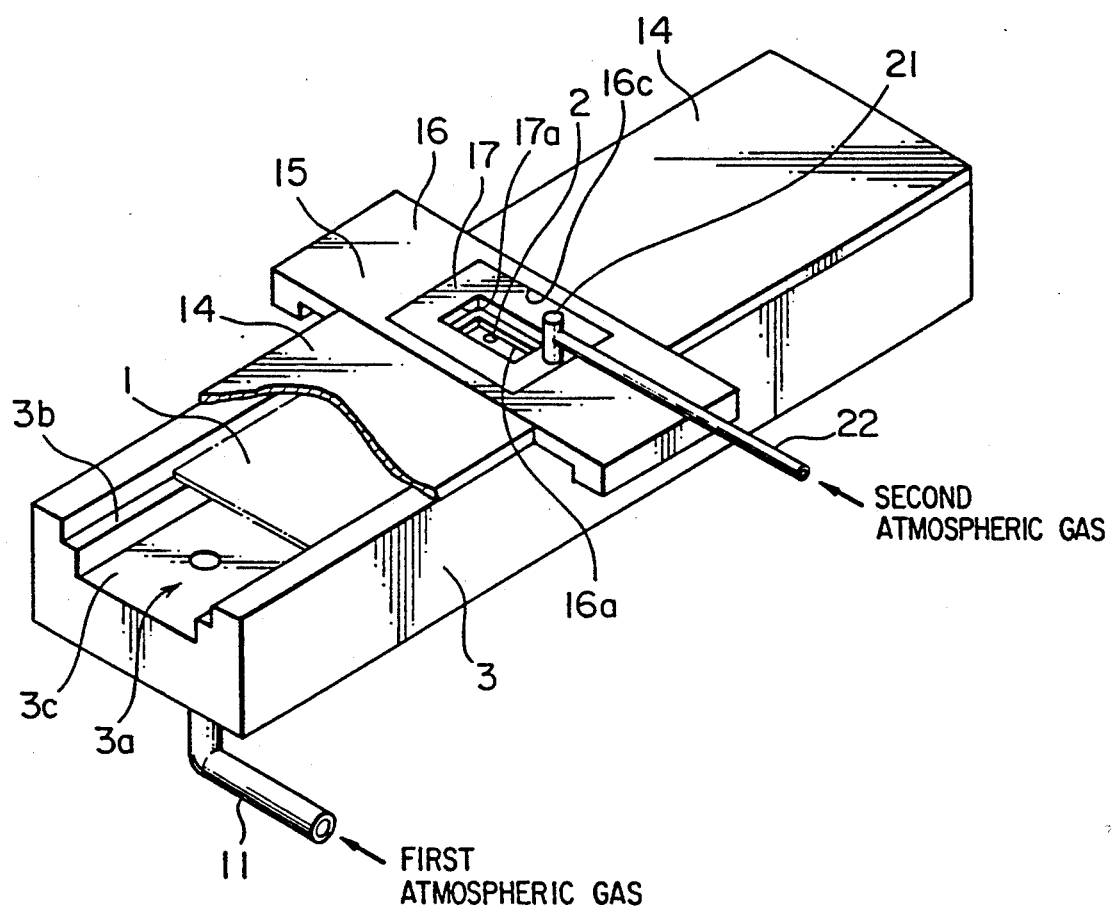
FIG. 3 is a perspective view illustrating portions of a wire bonding system having an apparatus for preventing the oxidation of a lead frame in accordance with an embodiment of the present invention.

In FIG. 3, a guide rail 3 has a longitudinally extending linear groove 3a of generally U-shaped cross section and a pair of parallel steps 3b formed on both sides of the groove 3a for supporting a lead frame 1. In addition, a first atmospheric gas-supplying pipe 11 for establishing communication between the interior of the groove 3a and a first gas supplying device (not shown) is provided in a bottom portion 3c of the groove 3a, penetrating the bottom portion 3c.

Figure 4:
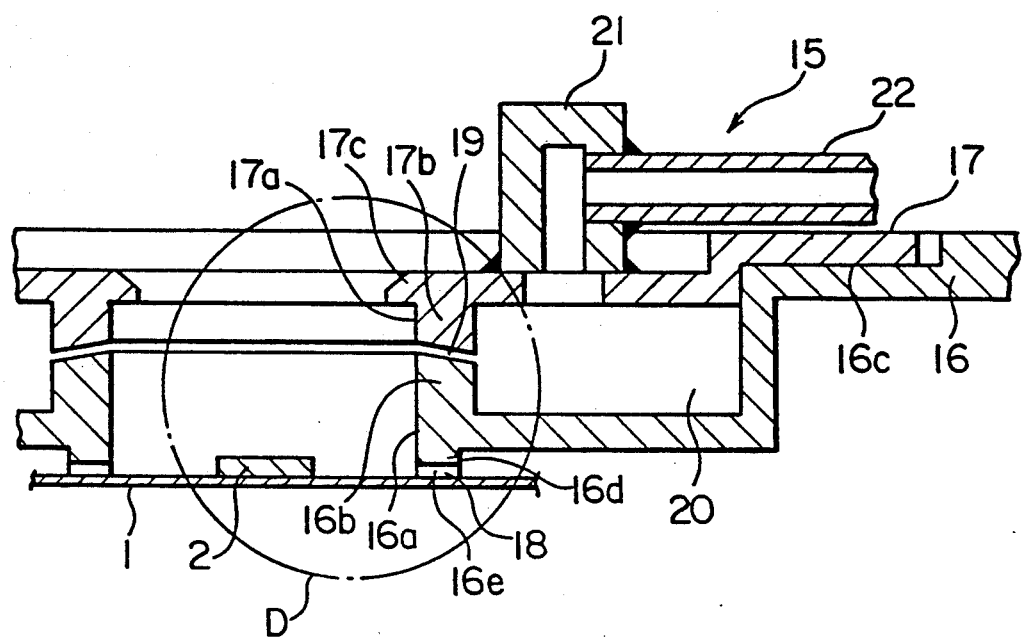
FIG. 4 is a partial cross-sectional view illustrating an embodiment of the present invention.

A frame holder 15 is disposed above a central portion of the guide rail 3, and a cover 14 closing the groove 3a is disposed on portions other than the central portion of the guide rail 3. As shown in FIG. 4, the frame holder 15 has a frame holder body 16 and a cover member 17 disposed on the frame holder body 16. The frame holder body 16 has a recess 16c provided on its surface, an opening 16a being formed in the central portion of this recess 16c. The opening 16a is defined by an annular wall 16b, a lower portion of the annular wall 16b projecting downward as a leg 16d for holding the lead frame 1. A plurality of radial grooves 16e are formed on the lower end surface of this leg 16d for communicating the opening 16a with the outer peripheral portion of the leg 16d. These grooves 16e serve as first atmospheric gas discharge ports 18.

The cover member 17 is secured within the recess 16c of the frame holder body 16 and has an opening 17a which is defined by an annular wall 17b and is provided in correspondence with the opening 16a of the frame holder body 16. An annular flange 17c projecting inward of the opening 17a is formed on an upper portion of the annular wall 17b. The lower end surface of the annular wall 17b of the cover member 17 and the upper end surface of the annular wall 16b of the frame holder body 16 are opposed to each other and are inclined upward toward the interior of the openings 17a, 16a, respectively, to form therebetween a gap which serves as a second atmospheric gas discharge port 19. In addition, a gas accumulating chamber 20 communicating with the second atmospheric gas discharge port 19 is formed around the outer peripheries of the annular walls 16b, 17b by the frame holder body 16 and the cover member 17. One end of a second atmospheric gas-supplying pipe 22 is connected to the gas accumulating chamber 20 via a joint 21, while the other end thereof is connected to a second gas-supplying device (not shown).

The frame holder 15 having the frame holder body 16 and the cover member 17 is provided on a central portion of the guide rail 3 and is movable vertically relative to the guide rail 3 by means of a driving device (not shown). The holding of the lead frame 1 is carried out as the frame holder 15 is lowered.

First, the lead frame 1 is guided onto the steps 3b within the groove 3a of the guide rail 3. When the semiconductor chip 2 mounted on the lead frame 1 is brought to a position immediately below the opening 16a of the frame holder body 16, the frame holder 15 is lowered by the driving device (not shown) so that the lead frame 1 is held down by the leg 16d of the frame holder body 16.

Figure 5:
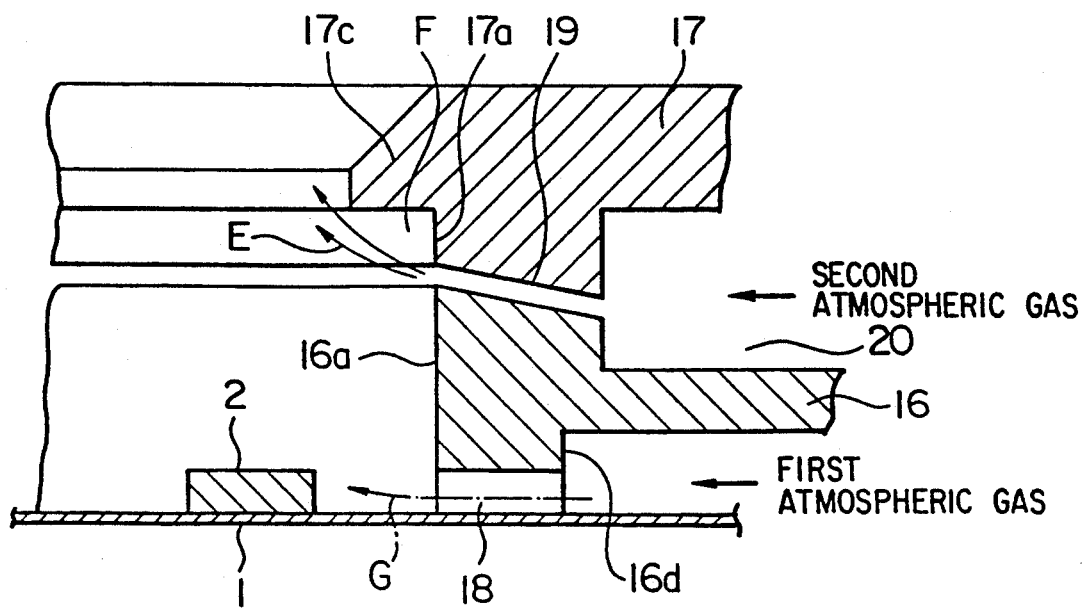
FIG. 5 is an enlarged view of a portion D shown in FIG. 4.

In this state, the first and second atmospheric gases such as reducing gases or inert gases are respectively introduced from the unillustrated first and second gas-supplying devices through the gas-supplying pipes 11, 22. The first atmospheric gas is introduced into the groove 3a of the guide rail 3 via the supplying pipe 11. The second atmospheric gas is introduced into the gas accumulating chamber 20 via the supplying pipe 22 and the joint 21. As shown in FIG. 5, the second atmospheric gas flows from the gas accumulating chamber 20 into the second gas discharge port 19 and is then discharged therefrom upwardly into the opening 16a of the frame holder body 16 and the opening 17a of the cover member 17. At this time, a vacuum is created in the vicinity of a space F located immediately below the inner flange 17c of the cover member 17. In consequence, the second atmospheric gas discharged through the second gas discharge port 19 curves upward under the action of the vacuum to form an upward flow E. Hence, the air flowing from above is shielded by the upward flow E and prevented from entering the opening 17a of the cover member 17 and the opening 16a of the frame holder body 16.

At this time, the first atmospheric gas introduced into the groove 3a of the guide rail 3 passes through the first gas discharge ports 18 formed between the lead frame 1 and the leg 16d of the frame holder body 16 and is discharged therefrom into the opening 16a of the frame holder body 16. This first atmospheric gas forms a flow G toward the semiconductor chip 2 mounted on the lead frame 1 along the upper surface of the lead frame 1 and is supplied to the vicinity of the semiconductor chip 2.

Thus, when air flowing from above is prevented from entering the openings 16a and 17a by discharging of the second atmospheric gas and the first atmospheric gas is supplied to the vicinity of the lead frame 1 and the semiconductor chip 2, wire bonding between the electrodes of the semiconductor chip 2 and the leads of the lead frame 1 is performed in the openings 16a, 17a of the frame holder body 16 and the cover member 17. Accordingly, oxidation of the lead frame 1 during wire bonding is prevented.

In addition, since the second atmospheric gas, after temporarily flowing into the gas accumulating chamber 20 and being accumulated therein, is discharged through the second gas discharge port 19, a loss of gas pressure resulting from a sudden change in the flow direction can be reduced.

It should be noted that a reducing gas such as hydrogen or an inert gas such as argon can be used as the first and second atmospheric gases. Additionally, an arrangement may be provided such that a common gas-supplying device is connected to the first and second atmospheric gas-supplying pipes 11, 22, and the atmospheric gas supplied from this gas-supplying device is distributed to the supplying pipes 11, 22.

In the above-described embodiment, an example has been described in which the apparatus for preventing the oxidation of a lead frame in accordance with the present invention is incorporated in a wire bonding system; however, the apparatus may be applied to a die bonding system for bonding semiconductor chips onto lead frames.

What is claimed is:

1. A method of preventing oxidation of a lead frame at elevated temperatures comprising directing a flow of a first gas simultaneously along, generally parallel to, and over a bonding portion of the lead frame and simultaneously directing a flow of a second gas initially generally parallel to and juxtaposed to the flow of the first gas and subsequently away from the bonding portion of the lead frame, the flow of the first gas being disposed adjacent to and solely on one side of the lead frame and between the lead frame and the flow of the second gas.

2. A method according to claim 1 including using a reducing gas as said first and second gases.

3. A method according to claim 1 including using an inert gas as said first and second gases.

* * * * *